(12) United States Patent
Yano et al.

(10) Patent No.: US 12,500,579 B2
(45) Date of Patent: Dec. 16, 2025

(54) OSCILLATOR CIRCUIT

(71) Applicant: Rohm Co., Ltd., Kyoto (JP)

(72) Inventors: Hiroki Yano, Kyoto (JP); Yo Yamashiro, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/597,517

(22) Filed: Mar. 6, 2024

(65) Prior Publication Data

US 2024/0305278 A1    Sep. 12, 2024

(30) Foreign Application Priority Data

Mar. 9, 2023   (JP) .................................. 2023-036676

(51) Int. Cl.
*H03K 3/03*   (2006.01)

(52) U.S. Cl.
CPC .................................. *H03K 3/0315* (2013.01)

(58) Field of Classification Search
CPC .................................................. H03K 3/0315
USPC .......................................................... 331/57
See application file for complete search history.

(56) References Cited

U.S. PATENT DOCUMENTS

| | | | | |
|---|---|---|---|---|
| 7,129,798 B2 * | 10/2006 | Aoyama | ............. | H03K 3/0231 331/135 |
| 8,436,687 B2 * | 5/2013 | Aruga | .................... | H03K 3/354 331/185 |
| 2014/0327486 A1 * | 11/2014 | Roine | ................. | H03K 3/0315 331/108 C |

FOREIGN PATENT DOCUMENTS

JP          2017-143416         8/2017

* cited by examiner

*Primary Examiner* — Joseph Chang
(74) *Attorney, Agent, or Firm* — Fish & Richardson P.C.

(57) ABSTRACT

The present disclosure provides an oscillator circuit. The oscillator circuit includes: a plurality of multi-stage inverters, connected in a ring shape to form a loop path; a capacitor, connected in series on the loop path; a charging/discharging control circuit, configured to charge/discharge the capacitor by pulse-driving a voltage level at a first end of the capacitor according to an output of any one of the multi-stage inverters; and a bias current generating circuit, configured to supply bias currents to each of the multi-stage inverters and the charging/discharging control circuit.

9 Claims, 4 Drawing Sheets

OSCILLATOR CIRCUIT

TECHNICAL FIELD

The present disclosure relates to an oscillator circuit.

BACKGROUND

A ring oscillator is one type of oscillator circuit (see FIG. 3 of Patent document 1). Such a ring oscillator includes a plurality of multi-stage inverters formed in a ring shape so as to form a loop path. A capacitor is connected to each inverter of each stage.

PRIOR ART DOCUMENT

Patent Publication

[Patent document 1] Japan Patent Publication 2017-143416

DETAILED DESCRIPTION OF THE EMBODIMENTS

<Oscillator Circuit Y of a Comparative Example>

First, a comparative example oscillator circuit Y will be described as a comparative example with the oscillator circuit X of the present disclosure.

Figure 1:
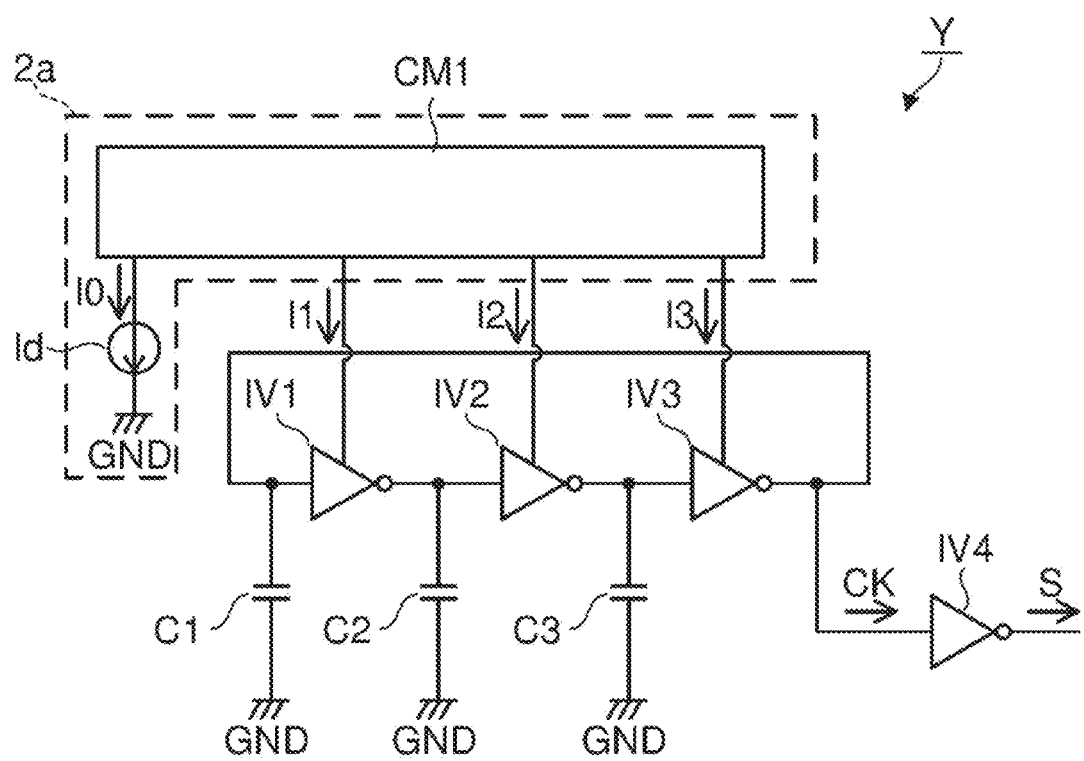
FIG. 1 is a diagram showing a schematic configuration of an embodiment of an oscillator circuit as a comparative example.

FIG. 1 is a diagram showing a schematic configuration of an embodiment of an oscillator circuit Y as the comparative example.

As shown in FIG. 1, the oscillator circuit Y includes a plurality of multi-stage inverters (here, inverters IV1 to IV3), multiple capacitors C1 to C3 and a bias current generating circuit 2a. The oscillator circuit Y generates a clock signal CK and inputs it to an inverter IV4.

The inverters IV1 to IV3 are connected in a ring shape to form a loop path. Specifically, an output end of the inverter IV1 is connected to an input end of the inverter IV2 together with one end of the capacitor C2. An output end of the inverter IV2 is connected to an input end of the inverter IV3 together with one end of the capacitor C3. An output end of the inverter IV3 is connected to an input end of the inverter IV1 together with one end of the capacitor C1 and an input end of the inverter IV4. The other ends of each of the capacitors C1 to C3 are connected to a ground terminal.

The bias current generating circuit 2a includes a current output circuit Id and a current mirror CM1. The current output circuit Id outputs a reference current I0. The current mirror CM1 mirrors the reference current I0 and supplies a first bias current I1, a second bias current I2 and a third bias current I3 to the inverters IV1 to IV3, respectively. Specifically, the first bias current I1 is supplied to the inverter IV1, the second bias current I2 is supplied to the inverter IV2 and the third bias current I3 is supplied to the inverter IV3.

The inverters IV1 to IV3 are complementary MOS (CMOS) inverters (figures are omitted) including a P-channel metal oxide semiconductor field effect transistor (MOSFET) and an N-channel MOSFET connected in series between the current mirror CM1 and a ground terminal (not shown).

The inverters IV1 to IV3 are configured that a voltage level at the output end is at a low level (=a ground level) when a voltage level at the input end is equal to or greater than a threshold value. Moreover, the inverters IV1 to IV3 are configured that the voltage level at the output end is at a high level when the voltage level at the input end is less than the threshold value. Hereinafter, the threshold value of the inverter IV1 is also referred to as a "threshold value t1."

The inverter IV4 generates an output signal S(=a rectangular wave signal obtained by inverting a logic level of the clock signal CK) according to the input clock signal CK. A frequency of the output signal S is simply referred to as an "oscillation frequency." Note that when it is understood that the output signal S is a final output of the oscillator circuit Y, the inverter IV4 can be understood as a component of the oscillator circuit Y.

The capacitors C1 to C3 are charged by the first to third bias currents I1 to I3. As shown in the figure, the capacitor C1 is charged by the third bias current I3, the capacitor C2 is charged by the first bias current I1 and the capacitor C3 is charged by the second bias current I2. Therefore, charging speeds of the capacitors C1 to C3 change depending on magnitudes of the first to third bias currents I1 to I3. An amount of delay in an output delay of the inverters IV1 to IV3 also changes depending on the charging speeds of the capacitors C1 to C3. When the amount of delay changes, a frequency of the clock signal CK changes.

For example, when the first to third bias currents I1 to I3 become greater, the charging speeds of the capacitors C1 to C3 become faster, and the amount of delay of the inverters IV1 to IV3 becomes less. Then, the frequency of the clock signal CK increases, and the oscillation frequency also increases.

In other words, the oscillation frequency of the oscillator circuit Y is determined by capacitances of the capacitors C1 to C3, the magnitudes of the first to third bias currents I1 to I3 and respective threshold values of the inverters IV1 to IV3.

In this way, in the oscillator circuit Y, since the first to third bias currents I1 to I3 and the oscillation frequency are interlocked with each other, it is difficult to reduce power consumption while obtaining the output signal S with a desired oscillation frequency.

<Oscillator Circuit X of the Present Disclosure>

Next, the oscillator circuit X of the present disclosure will be explained. Note that, in the following, differences between configurations of the oscillator circuit X and the oscillator circuit Y according to the comparative example will be described, and configurations similar to the oscillator circuit Y will be given the same reference numerals and explanations will be omitted.

Figure 2:
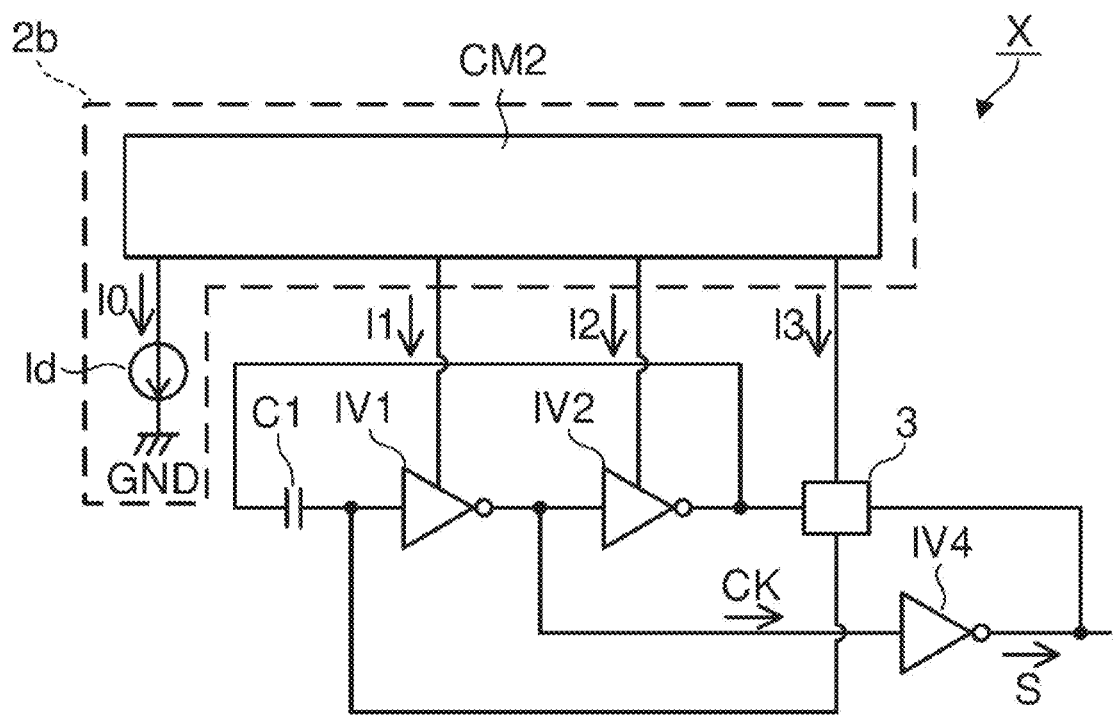
FIG. 2 is a diagram showing a schematic configuration of an embodiment of an oscillator circuit of the present disclosure.
Figure 3:
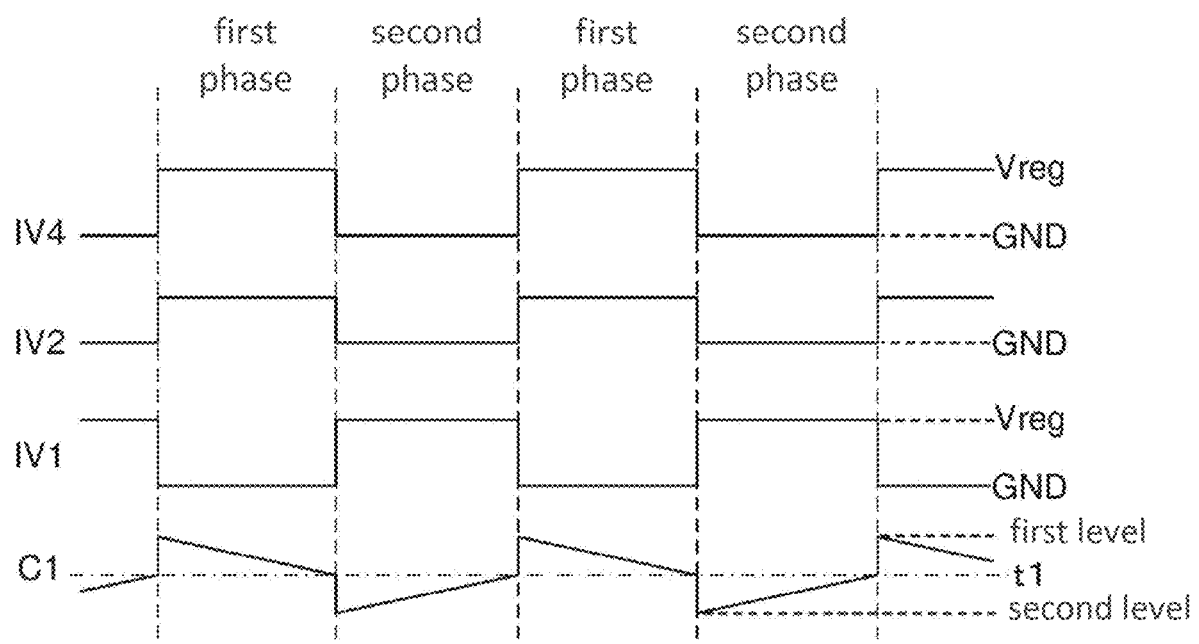
FIG. 3 is a timing chart showing voltage levels at an output end of an inverter in first and second phases, a voltage level at an output end of the inverter, a voltage level at the output end of the inverter and a voltage level at a first end of a capacitor (=a connection end with the input end of the inverter).

FIG. 2 is a diagram showing a schematic configuration of an embodiment of the oscillator circuit X of the present disclosure. FIG. 3 is a timing chart showing, in order from the top, voltage levels at an output end of the inverter IV4 in the first and second phases, a voltage level at an output end of the inverter IV2, a voltage level at an output end of the inverter IV1 and a voltage level at a first end of the capacitor C1. (=a connection end with an input end of the inverter IV1).

As shown in FIG. 2, the oscillator circuit X includes a plurality of multi-stage inverters (here, inverters IV1 and IV2), a capacitor C1, a charging/discharging control circuit 3, a bias current generating circuit 2b and an inverter IV4. The oscillator circuit X generates a clock signal CK and inputs the clock signal CK to the inverter IV4.

The inverters IV1, IV2 and the capacitor C1 are connected in a ring shape to form a loop path. Specifically, the output end of the inverter IV1 is connected to the input end of the inverter IV2. A first end of the capacitor C1 is connected to the input end of the inverter IV1. A second end of the capacitor C1 is connected to an output end of the inverter IV2.

A first end of the charging/discharging control circuit 3 is connected to an output end of the bias current generating circuit 2b (=the output end of the third bias current I3). A second end of the charging/discharging control circuit 3 is connected to the second end of the capacitor C1 together with the output end of the inverter IV2. A third end of the charging/discharging control circuit 3 is connected to the input end of the inverter IV1 together with the first end of the capacitor C1. A fourth end of the charging/discharging control circuit 3 is connected to the output end of the inverter IV4 (=an application terminal of an output signal S).

The bias current generating circuit 2b includes a current output circuit Id and a current mirror CM2. The current mirror CM2 mirrors a reference current I0 and supplies the first to third bias currents I1 to I3 to the inverters IV1, IV2 and the charging/discharging control circuit 3, respectively. Specifically, the first bias current I1 is supplied to the inverter IV1, the second bias current I2 is supplied to the inverter IV2 and the third bias current I3 is supplied to the charging/discharging control circuit 3.

The input end of the inverter IV4 is connected to the input end of the inverter IV2 as well as the output end of the inverter IV1.

The inverter IV4 is configured that when the voltage level at the input end (=the voltage level of the clock signal CK) exceeds a threshold value, the voltage level at the output end (=the voltage level of the output signal S) becomes the ground level. Furthermore, the inverter IV4 is configured that when the voltage level at the input end becomes less than the threshold value, the voltage level at the output end becomes a power supply voltage level (=Vreg).

The charge/discharge control circuit 3 is configured to charge and discharge the capacitor C1 by pulse-driving a voltage level at the first end of the capacitor C1 to alternately change it between the first level and the second level according to the output of the inverter IV4 (=the voltage level at the output end of the inverter IV4, that is, the voltage level of the output signal S).

Specifically, it is as follows. As shown in FIG. 3, when the voltage level at the output end of inverter IV4 is at the power supply voltage level (=Vreg), the charge/discharge control circuit 3 sets the voltage level at the first end of the capacitor C1 to the first level. The first level is a voltage level greater than or equal to the threshold value t1 of the inverter IV1.

Furthermore, when the voltage level at the output end of the inverter IV4 is at the ground level, the charging/discharging control circuit 3 sets the voltage level at the first end of the capacitor C1 to the second level. The second level is a voltage level less than the threshold value t1 of the inverter IV1. Hereinafter, a state in which the voltage level at the first end of the capacitor C1 is at the first level will be referred to as a first phase, and a state in which the same voltage level is at the second level will be referred to as a second phase.

In the first phase, the second bias current I2 is supplied to the capacitor C1. At this time, the second bias current I2 passes through the inverter IV2 and flows from the second end to the first end of the capacitor C1 (see FIG. 2). At this time, an amount of charge in the capacitor C1 gradually decreases. In other words, at this time, the capacitor C1 is discharging.

On the other hand, in the second phase, the third bias current I3 is supplied to the capacitor C1. At this time, the third bias current I3 flows from the first end to the second end of the capacitor C1 through the charging/discharging control circuit 3 (see FIG. 2). At this time, the amount of charge in the capacitor C1 gradually increases. In other words, at this time, the capacitor C1 is charged.

Here, the voltage level at the first end of the capacitor C1 is a value equal to a sum of the voltage level at the second end of the capacitor C1 (=the voltage level at the output end of the inverter IV2) and the voltage of the capacitor C1 (=a product of capacitance and charge amount of the capacitor C1). Therefore, in the first phase, the voltage level at the first end of the capacitor C1 gradually decreases as the amount of charge in the capacitor C1 decreases (see FIG. 3). Furthermore, in the second phase, the voltage level at the first end of the capacitor C1 gradually increases as the amount of charge in the capacitor C1 increases (see FIG. 3).

A switch from the first phase to the second phase is described as follows. In the first phase, the voltage level at the first end of the capacitor C1 gradually decreases. When the voltage level falls below the threshold value t1 of the inverter IV1, the voltage level at the output end of the inverter IV1 (=the input end of the inverter IV2 and the input end of the inverter IV4) rises from the low level (=the ground level, that is, a voltage level below the threshold value of the inverter IV2) to the power supply voltage level (=a level above the threshold value of the inverter IV2).

Then, the voltage level at the output end of the inverter IV2 falls to the low level (=the ground level), and the output signal S of the oscillator circuit X (=the voltage level at the output end of the inverter IV4) falls to the low level (=the ground level). As a result, the voltage level at the first end of the capacitor C1 becomes the above-mentioned second level. In this way, the first phase is switched to the second phase.

The switch from the second phase to the first phase is described as follows. In the second phase, the voltage level at the first end of the capacitor C1 gradually increases and when it reaches the threshold value t1 of the inverter IV1, the voltage level at the output end of the inverter IV1 (=the input end of the inverter IV2) falls from a high level (=the power supply voltage level) to a low level (=the ground level, that is, the voltage level below the threshold value of the inverter IV2).

Then, the voltage level at the output end of the inverter IV2 rises to the high level, and an oscillation output (=the voltage level at the output end of the inverter IV4) rises to the high level (=the power supply voltage level). As a result, the voltage level at the first end of the capacitor C1 becomes the above-mentioned first level. In this way, the second phase is switched to the first phase.

As described above, the capacitor C1 is charged by the third bias current I3. A charging speed of the capacitor C1 changes depending on a magnitude of the third bias current I3. The charging speed is a speed from a start of the second phase (=a charging start point) to an end of the first phase (=a charging end point). In other words, it is the speed at which the amount of charge in the capacitor C1 reaches a predetermined amount (the amount by which the voltage level at the first end of the capacitor C1 reaches the threshold value t1).

An amount of delay in the output delay of the inverter IV1 changes depending on the charging speed of the capacitor C1. Therefore, a frequency of the clock signal CK changes depending on the amount of delay and, in turn, the magnitude of the third bias current I3.

For example, when the third bias current I3 increases, the charging speed of the capacitor C1 increases, and the amount of delay of the inverter IV1 decreases. Then, the frequency of the clock signal CK increases. Conversely, when the third bias current I3 becomes less, the frequency of the clock signal CK becomes less.

Here, magnitudes of the first bias current I1 and the second bias current I2 do not directly contribute to the frequency value of the clock signal CK. Therefore, while the frequency of the clock signal CK is set to a predetermined value, the first bias current I1 and the second bias current I2 can be made small within a range that can drive the inverters IV1 and IV2. Therefore, the oscillator circuit X can obtain the output signal S of a desired oscillation frequency while having relatively low power.

Furthermore, the threshold values of inverters IV1 and IV2 are not directly related to the frequency of the clock signal CK, that is, the oscillation frequency. Therefore, the oscillator circuit X is less susceptible to product variations in the inverters IV1 and IV2, and the output signal S of the desired oscillation frequency can be obtained with a relatively high accuracy.

Figure 4:
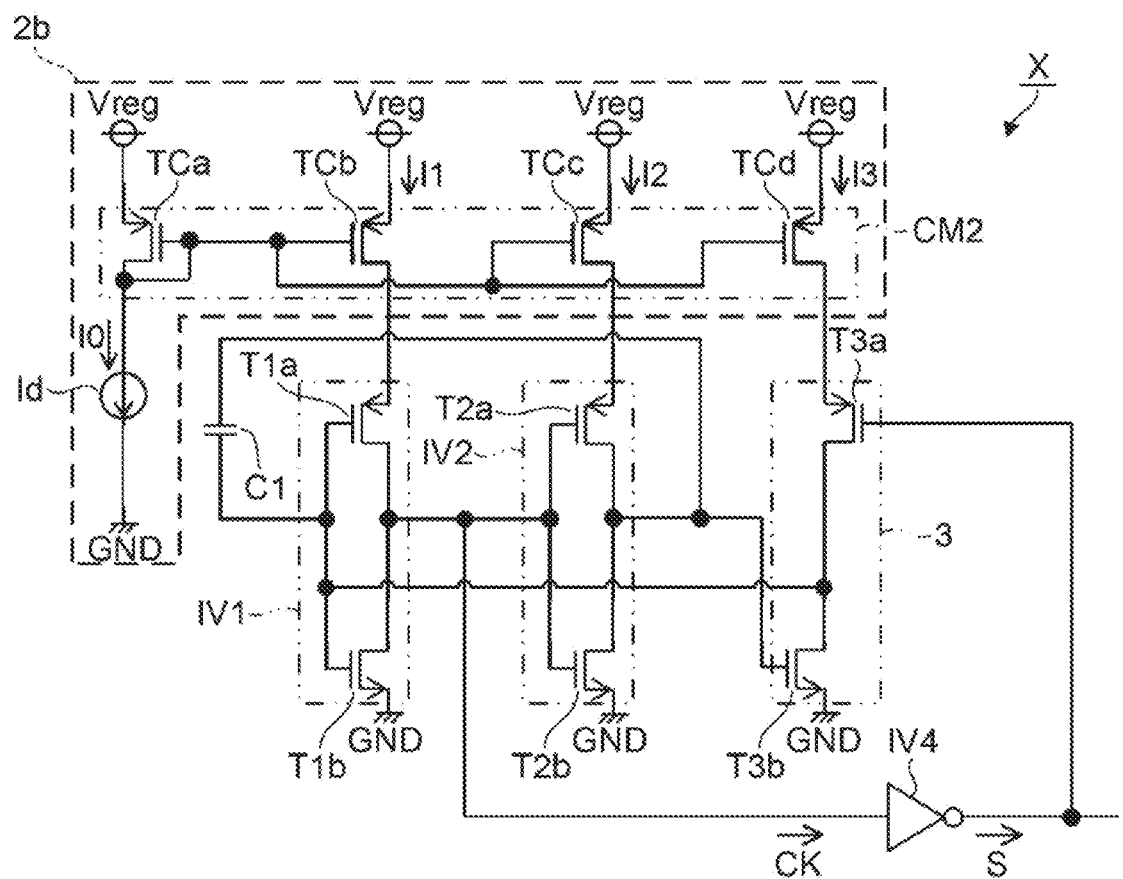
FIG. 4 is a block diagram showing a configuration of an oscillator circuit X.

The configuration of the oscillator circuit X of the present disclosure will be explained in more detail. FIG. 4 is a block diagram showing the configuration of the oscillator circuit X.

As shown in FIG. 4, the current mirror CM2 includes transistors TCa to TCd. The transistors TCa to TCd are P-channel MOSFETs.

Sources of transistors TCa to TCd are each connected to the application terminal of power supply voltage Vreg. Gates of transistors TCa to TCd are each connected to a drain of the transistor TCa. The drain of the transistor TCa is connected to the current output circuit Id.

A drain of the transistor TCb is connected to the inverter IV1 (a source of the transistor T1a, which will be described later). A drain of the transistor TCc is connected to the inverter IV2 (a source of the transistor T2a, which will be described later). A drain of the transistor TCd is connected to the first end of the charging/discharging control circuit 3 (a source of the transistor T3a, which will be described later).

The inverter IV1 includes a transistor T1a and a transistor T1b. The transistor T1a is a P-channel MOSFET. The transistor T1b is an N-channel MOSFET.

A gate of the transistor T1a and a gate of the transistor T1b constitute the input end of the inverter IV1. That is, the gate of the transistor T1a is connected to the first end of the capacitor C1 together with the gate of the transistor T1b.

A drain of the transistor T1a and a drain of the transistor T1b constitute the output end of the inverter IV1. That is, the drain of the transistor T1a is connected to the input end of the inverter IV2 (a gate of the transistor T2a and a gate of the transistor T2b, which will be described later), together with the drain of the transistor T1b. A source of the transistor T1b is connected to the ground terminal.

The inverter IV1 is configured that when the voltage level at the input end (=voltage level at the gate of the transistor T1a and the gate of the transistor T1b) becomes equal to or greater than threshold value t1, the transistor T1a is turned off and the transistor T1b is turned on.

The inverter IV2 includes a transistor T2a and a transistor T2b. The transistor T2a is a P-channel MOSFET. The transistor T2b is an N-channel MOSFET.

The gate of the transistor T2a and the gate of the transistor T2b constitute the input end of the inverter IV2.

A drain of the transistor T2a and a drain of the transistor T2b constitute the output end of the inverter IV2. That is, the drain of the transistor T2a is connected to the second end of the capacitor C1 and the second end of the charging/discharging control circuit 3 (a gate of the transistor T3b, which will be described later), as well as the drain of the transistor T2b. A source of the transistor T2b is connected to the ground terminal.

The inverter IV2 is configured that when the voltage level at the input end (=voltage level at the gate of the transistor T2a and the gate of the transistor T2b) exceeds a threshold value, the transistor T2a is turned off and the transistor T2b is turned on.

The charging/discharging control circuit 3 includes a transistor T3a and a transistor T3b. A gate of the transistor T3a is connected to the output end of the inverter IV4. A drain of the transistor T3a and a drain of the transistor T3b are connected to the first end of the capacitor C1. A source of the transistor T3b is connected to the ground terminal.

In the charging/discharging control circuit 3, when the voltage level at the gate of the transistor T3a becomes equal to or greater than a predetermined threshold value, the transistor T3a is turned off. Furthermore, the charging/discharging control circuit 3 is configured that the transistor T3b is turned on when the voltage level at the gate of the transistor T3b becomes equal to or greater than the predetermined threshold value. Furthermore, in the charging/discharging control circuit 3, when the voltage level at the gate of the transistor T3a becomes less than the predetermined threshold value, the transistor T3a is turned on. Furthermore, the charging/discharging control circuit 3 is configured that the transistor T3b is turned off when the voltage level at the gate of the transistor T3b becomes less than the predetermined threshold value.

As described above, in the first phase, the oscillation output of the inverter IV4 (=the voltage level at the output end of the inverter IV4, that is, the voltage level at the gate of the transistor T3a) is equal to the power supply voltage level (=Vreg, that is, the charging/discharging control circuit 3 voltage level above the threshold value). Thus, the transistor T3a is turned off. Furthermore, in the first phase, the voltage level at the output end of the inverter IV2, that is, the voltage level at the gate of the transistor T3b becomes equal to or greater than the threshold value of the transistor T3b. Thus, transistor T3b is turned on.

Furthermore, at this time, the voltage level at the first end of the capacitor C1 (=the voltage level at the gate of the transistor T1a and the gate of the transistor T1b) is equal to or greater than the threshold value t1 of the inverter IV1. Thus, the transistor T1a is turned off and the transistor T1b is turned on.

Furthermore, at this time, the voltage level at the output end of the inverter IV (=the voltage level at the gate of the transistor T2a and the gate of the transistor T2b) is at the low level (=the ground level). Thus, the transistor T2a is turned on and the transistor T2b is turned off.

Therefore, in the first phase, the second bias current I2 flows from the source to the drain of the transistor T2a, flows from the second end of the capacitor C1 to the first end, flows from the drain to the source of the transistor T3b, and flows to the ground terminal.

On the other hand, in the second phase, as described above, the oscillation output of the inverter IV4 (=the voltage level at the gate of the transistor T3a) is at the ground level (=the voltage level below the threshold value of the charging/discharging control circuit 3). Thus, the transistor T3a is turned on. Furthermore, in the second phase, the voltage level at the output end of the inverter IV2, that is, the voltage level at the gate of the transistor T3b, becomes less than the threshold value of the transistor T3b. Thus, the transistor T3b is turned off.

Furthermore, at this time, the voltage level at the first end of the capacitor C1 (=the voltage level at the gate of the transistor T1a and the gate of the transistor T1b) is less than the threshold value t1 of the inverter IV1, as described above. Thus, the transistor T1a is turned on and the transistor T1b is turned off.

Furthermore, at this time, the voltage level at the output end of the inverter IV1 (=the voltage level at the gate of the transistor T2a and the gate of the transistor T2b) is at the high level (=the power supply voltage level). Thus, the transistor T2a is turned off and the transistor T2b is turned on.

Therefore, in the second phase, the third bias current I3 flows from the source to the drain of the transistor T3a, flows from the first end to the second end of the capacitor C1, flows from the drain to the source of the transistor T2b, and flows into the ground terminal.

Note that the various technical features disclosed in this specification can be modified in addition to the above-described embodiments without departing from the gist of the technical creation. That is, the above embodiments should be considered to be illustrative in all respects and not restrictive, and the technical scope of the present disclosure is not limited to the above embodiments, and the claims shall be understood to include all changes falling within the meaning and range of equivalency.

For example, although the multi-stage inverters of the oscillator circuit X according to the above embodiment includes two inverters (the inverters IV1 and IV2), the oscillator circuit X can include more than three (preferably an even number) inverters.

Furthermore, the current output circuit Id of the oscillator circuit X according to the embodiment described above can be configured that the reference current I0 is changeable. By changing the reference current I0, the magnitudes of the first to third bias currents I1 to I3 are changeable and the charging speed of the capacitor C1 can be adjusted. This allows the oscillator circuit X to adjust the oscillation frequency as appropriate.

To explain in more detail using FIG. 3, when the third bias current I3 is increased, a slope of a graph showing the voltage level at the first end of the capacitor C1 becomes greater. Therefore, in the first phase, the time it takes for the voltage level to fall below the threshold value t1 becomes shorter; in the second phase, the time it takes for the voltage level to reach the threshold value t1 becomes shorter.

Conversely, when the third bias current I3 is decreased, the slope of the graph showing the voltage level at the first end of the capacitor C1 becomes less. Therefore, in the first phase, the time it takes for the same voltage level to fall below the threshold value t1 becomes longer; in the second phase, the time it takes for the same voltage level to reach the threshold value t1 becomes longer.

As described above, the amount of output delay of the inverter IV1 changes depending on the charging speed of the capacitor C1, and the frequency of the clock signal CK also changes. Therefore, by changing the reference current I0 using the current output circuit Id and adjusting the charging speed of the capacitor C1, the oscillation frequency of the oscillator circuit X can be adjusted as appropriate.

Furthermore, the oscillator circuit X according to the above embodiment can employ a variable capacitor (so-called trimming capacitor) having a changeable capacitance, as the capacitor C1. Changing the capacitance also changes the charging rate of the capacitor C1. Based on a relationship between this capacitance and the charging speed of the capacitor C1, the oscillator circuit X can adjust the oscillation frequency as appropriate by using the capacitor C1 as a variable capacitor.

To explain specifically using FIG. 3, when the capacitance of the capacitor C1 is increased, an amplitude of the voltage level at the first end of the capacitor C1 (=a width between a maximum voltage and a minimum voltage) increases. Then, in the first phase, it takes a long time for the same voltage level to fall below the threshold value, and in the second phase, it takes a long time for the same voltage level to reach the threshold value.

In this way, by using the capacitor C1 as a variable capacitor, the oscillation frequency of the oscillator circuit X can be adjusted by changing the capacitance.

The oscillator circuit X according to the above embodiment preferably has a configuration in which the current output circuit Id is configured to be capable of changing the reference current I0 as described above, and a variable capacitor is used as the capacitor C1.

In this case, if the reference current I0 is made too small, it is possible that the inverters IV1, IV2 and the charging/discharging control circuit 3 cannot be driven by the first to third bias currents I1 to I3.

Therefore, when adopting such configuration, roughly changing the oscillation frequency by changing the reference current I0 within a range where the inverters IV1, IV2 and the charging/discharging control circuit 3 can be driven by the first to third bias currents I1 to I3, it is possible to further fine-tune the oscillation frequency by changing the capacitance of the capacitor C1 (=variable capacitor).

(First configuration) The oscillator circuit (X) disclosed in the specification is configured as follows, including: a plurality of multi-stage inverters (IV1, IV2), connected in a ring shape to form a loop path; a capacitor (C1), connected in series on the loop path; a charging/discharging control circuit, configured to charge/discharge the capacitor (C1) by pulse-driving a voltage level at a first end of the capacitor (C1) according to an output of any one of the multi-stage inverters (IV1, IV2); and a bias current generating circuit (2b), configured to supply bias currents (I1 to I3) to each of the multi-stage inverters (IV1, IV2) and the charging/discharging control circuit (3).

(Second configuration) Furthermore, the oscillator circuit (X) of the first configuration, wherein the first end of the capacitor (C1) is connected to an input end of a first inverter (IV1) of the multi-stage inverters (IV1, IV2), a second end of the capacitor (C1) is connected in series with an output end of a second inverter (IV2) of the multi-stage inverters (IV1, IV2), the bias current generating circuit (2b) is configured to, supply a first bias current (I1) to the first inverter (IV1); supply a second bias current (I2) to the second inverter (IV2); and supply a third bias current (I3) to the charging/discharging control circuit (3), wherein the first bias current (I1), the second bias current (I2) and the third bias current (I3) are the bias current (I1 to I3), in a first phase, which is a state when the voltage level at the first end of the capacitor (C1) is equal to or greater than a threshold value (t1) of the first inverter (IV1), the second bias current (I2) flows in a direction from the second end to the first end of the capacitor (C1), and in a second phase, which is a state when the voltage level at the first end of the capacitor (C1) is less the threshold value (t1), the third bias current (I3) flows in a direction from the first end to the second end of the capacitor (C1).

(Third configuration) Furthermore, the oscillator circuit (X) of the second configuration, wherein the bias current generating circuit (2b) is configured that the third bias current (I3) is greater than the first bias current (I2) and the second bias current (I3).

(Fourth configuration) Furthermore, the oscillator circuit (X) of the second or third configuration, wherein the first inverter (IV1) includes a first transistor (T1a) and a second transistor (T1b), the second inverter (IV2) includes a third transistor (T2a) and a fourth transistor (T2b), the charging/discharging control circuit (3) includes a fifth transistor (T3a) and a sixth transistor (T3b), control ends of each of the first transistor (T1a) and the second transistor (T1b) are connected to the first end of the capacitor (C1), a control end of the third transistor (T2a) and a control end of the fourth transistor (T2b) are respectively connected to a first end of the first transistor (T1a) and a first end of the second transistor (T1b), a control end of the fifth transistor (T3a) is connected to the second end of the capacitor (C1), a first end of the fifth transistor (T3a) is connected to a ground terminal, a second end of the fifth transistor (T3a) is connected to a first end of the sixth transistor (T3b), a control end of the sixth transistor (T3b) is connected to an output end of any one of the multi-stage inverters, and a second end of the sixth transistor (T3b) is connected to the bias current generating circuit (2b).

(Fifth configuration) Furthermore, the oscillator circuit (X) of any one of the first to fourth configurations, wherein the bias current generating circuit (2b) is configured to be capable of changing a magnitude of the bias current (I1 to I3).

(Sixth configuration) Furthermore, the oscillator circuit (X) of any one of the first to fifth configurations, wherein the capacitor (C1) is a variable capacitor having a changeable capacitance.

According to the oscillator circuit (X) of the first configuration, by charging and discharging the capacitor (C1) by the charging/discharging control circuit (3), the bias current (I1, I2) supplied to each inverter (IV1, IV2) is reduced. It is possible to obtain a desired oscillation frequency and reduce power consumption.

According to the oscillator circuit (X) of the second configuration, it is possible to reduce the first bias current (I1) and the second bias current (I2) while obtaining a desired oscillation frequency. Therefore, power consumption can be reduced more suitably.

According to the oscillator circuit (X) of the third configuration, it is possible to reduce the first bias current (I1) and the second bias current (I2) while obtaining a desired oscillation frequency.

According to the oscillator circuit (X) of the fourth configuration, it is possible to provide an oscillator circuit that can reduce the first bias current (I1) and the second bias current (I2) while obtaining a desired oscillation frequency.

According to the oscillator circuit (X) of the fifth configuration, the oscillation frequency of the oscillator circuit is changeable in an oscillator circuit that can reduce power consumption while obtaining a desired oscillation frequency.

According to the oscillator circuit (X) of the sixth configuration, the oscillation frequency of the oscillator circuit is changeable in an oscillator circuit that can reduce power consumption while obtaining a desired oscillation frequency.

INDUSTRIAL APPLICABILITY

The oscillator circuit according to the present disclosure can be used in switching power supplies or the like.

The invention claimed is:
1. An oscillator circuit, comprising:
a plurality of multi-stage inverters, connected in a ring shape to form a loop path;
a capacitor arranged in the loop path and connected to the plurality of multi-stage inverters in series;
a charging/discharging control circuit, configured to charge/discharge the capacitor by pulse-driving a voltage level at a first end of the capacitor according to an output of any one of the plurality of multi-stage inverters; and
a bias current generating circuit, configured to supply bias currents to each of the multi-stage inverters and the charging/discharging control circuit,
wherein the first end of the capacitor is connected to an input end of a first inverter of the multi-stage inverters,
a second end of the capacitor is connected in series with an output end of a second inverter of the multi-stage inverters,
the bias current generating circuit is configured to:
supply a first bias current to the first inverter;
supply a second bias current to the second inverter; and
supply a third bias current to the charging/discharging control circuit,
wherein the first bias current, the second bias current and the third bias current are the bias current,
wherein in a first phase, which is a state when the voltage level at the first end of the capacitor is equal to or greater than a threshold value of the first inverter, the second bias current flows in a direction from the second end to the first end of the capacitor, and
wherein in a second phase, which is a state when the voltage level at the first end of the capacitor is less the threshold value, the third bias current flows in a direction from the first end to the second end of the capacitor.
2. The oscillator circuit of claim 1, wherein the bias current generating circuit is configured that the third bias current is greater than the first bias current and the second bias current.
3. The oscillator circuit of claim 1, wherein
the first inverter includes a first transistor and a second transistor,
the second inverter includes a third transistor and a fourth transistor,
the charging/discharging control circuit includes a fifth transistor and a sixth transistor,
control ends of each of the first transistor and the second transistor are connected to the first end of the capacitor, a control end of the third transistor and a control end of the fourth transistor are respectively connected to a first end of the first transistor and a first end of the second transistor, a control end of the fifth transistor is connected to the second end of the capacitor, a first end of the fifth transistor is connected to a ground terminal, a second end of the fifth transistor is connected to a first end of the sixth transistor, a control end of the sixth transistor is connected to an output end of any one of the multi-stage inverters, and a second end of the sixth transistor is connected to the bias current generating circuit.

4. The oscillator circuit of claim 1, wherein the bias current generating circuit is configured to be capable of changing a magnitude of the bias current.

5. The oscillator circuit of claim 1, wherein the capacitor is a variable capacitor having a changeable capacitance.

6. The oscillator circuit of claim 1, wherein the capacitor is a variable capacitor having a changeable capacitance.

7. The oscillator circuit of claim 2, wherein the capacitor is a variable capacitor having a changeable capacitance.

8. The oscillator circuit of claim 3, wherein the capacitor is a variable capacitor having a changeable capacitance.

9. The oscillator circuit of claim 4, wherein the capacitor is a variable capacitor having a changeable capacitance.

* * * * *